United States Patent
Kaneki et al.

(10) Patent No.: US 12,488,985 B2
(45) Date of Patent: Dec. 2, 2025

(54) SEMICONDUCTOR LAMINATE AND METHOD FOR MANUFACTURING SEMICONDUCTOR LAMINATE

(71) Applicant: SUMITOMO CHEMICAL COMPANY, LIMITED, Tokyo (JP)

(72) Inventors: Shota Kaneki, Hitachi (JP); Hajime Fujikura, Hitachi (JP); Taichiro Konno, Hitachi (JP); Takeshi Kimura, Hitachi (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 503 days.

(21) Appl. No.: 18/102,138

(22) Filed: Jan. 27, 2023

(65) Prior Publication Data
US 2023/0245885 A1    Aug. 3, 2023

(30) Foreign Application Priority Data
Jan. 28, 2022   (JP) ................................. 2022-011846

(51) Int. Cl.
*H01L 21/02* (2006.01)

(52) U.S. Cl.
CPC .. *H01L 21/02579* (2013.01); *H01L 21/02458* (2013.01); *H01L 21/0254* (2013.01); *H01L 21/0262* (2013.01); *H01S 2304/04* (2013.01)

(58) Field of Classification Search
CPC ......... H01L 21/02579; H01L 21/02458; H01L 21/0254; H01L 21/0262; H01L 21/02502; H01L 21/02389; H01L 21/02576; H01L 21/0257; H01S 2304/04; H01S 5/3063; H01S 5/34333; H10D 8/00; H10D 62/8503

See application file for complete search history.

(56) References Cited

U.S. PATENT DOCUMENTS

| | | | |
|---|---|---|---|
| 2007/0278518 A1* | 12/2007 | Chen .................. | H10D 30/4755 257/192 |
| 2009/0278166 A1* | 11/2009 | Soeno .................. | H10D 12/481 257/133 |
| 2011/0128981 A1 | 6/2011 | Kinoshita et al. | |
| 2016/0020284 A1* | 1/2016 | D'Evelyn ............ | H10H 20/825 428/64.1 |

FOREIGN PATENT DOCUMENTS

| WO | WO-2004/061923 A1 | 7/2004 |
|---|---|---|
| WO | WO-2008/117750 A1 | 10/2008 |

OTHER PUBLICATIONS

Mori et al., "Recent progress of Na-flux method for GaN crystal growth," Japanese Journal of Applied Physics, vol. 58, 2019, pp. SC0803-1 to SC0803-10.

\* cited by examiner

*Primary Examiner* — Yasser A Abdelaziez
(74) *Attorney, Agent, or Firm* — Foley & Lardner LLP

(57) ABSTRACT

There is provided a semiconductor laminate, comprising: a substrate; and a p-type layer provided above the substrate and comprising a group III nitride containing Mg, wherein C concentration in the p-type layer is less than $5\times10^{15}$ cm$^{-3}$, O concentration in the p-type layer is less than $5\times10^{15}$ cm$^{-3}$, Si concentration in the p-type layer is less than $1\times10^{15}$ cm$^{-3}$, and F concentration in the p-type layer is $1\times10^{14}$ cm$^{-3}$ or more.

14 Claims, 7 Drawing Sheets

[Fig. 1]
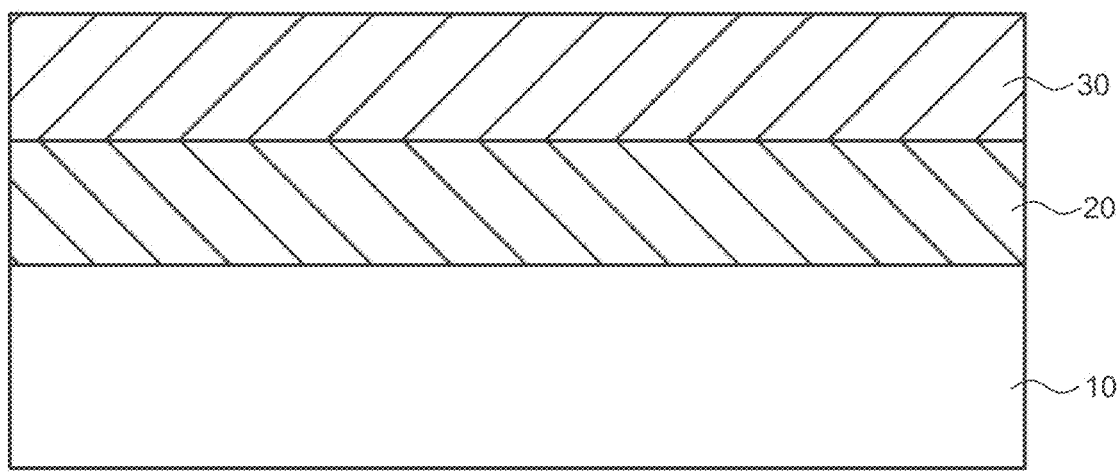

[Fig. 2]
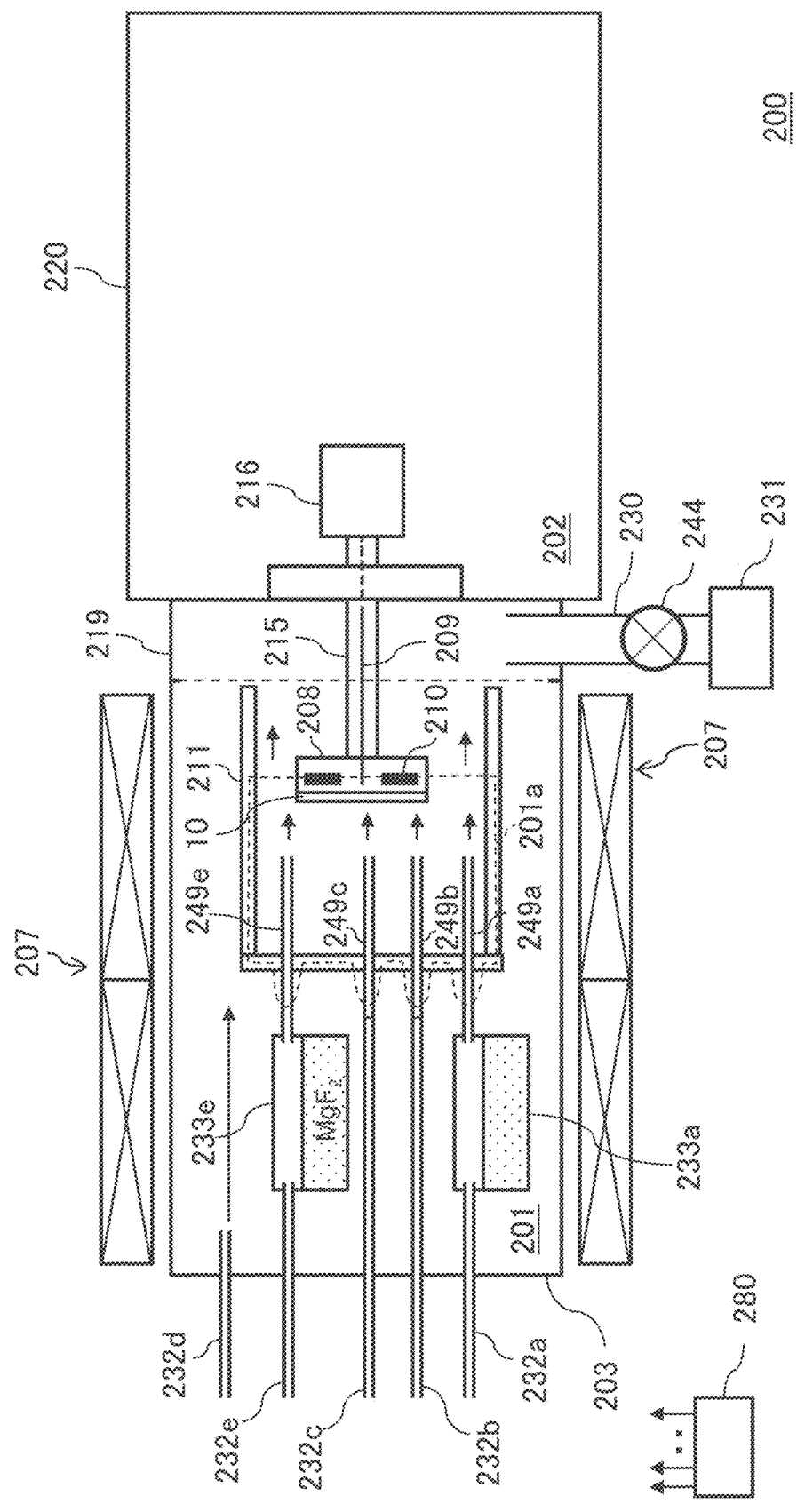

[Fig. 3]
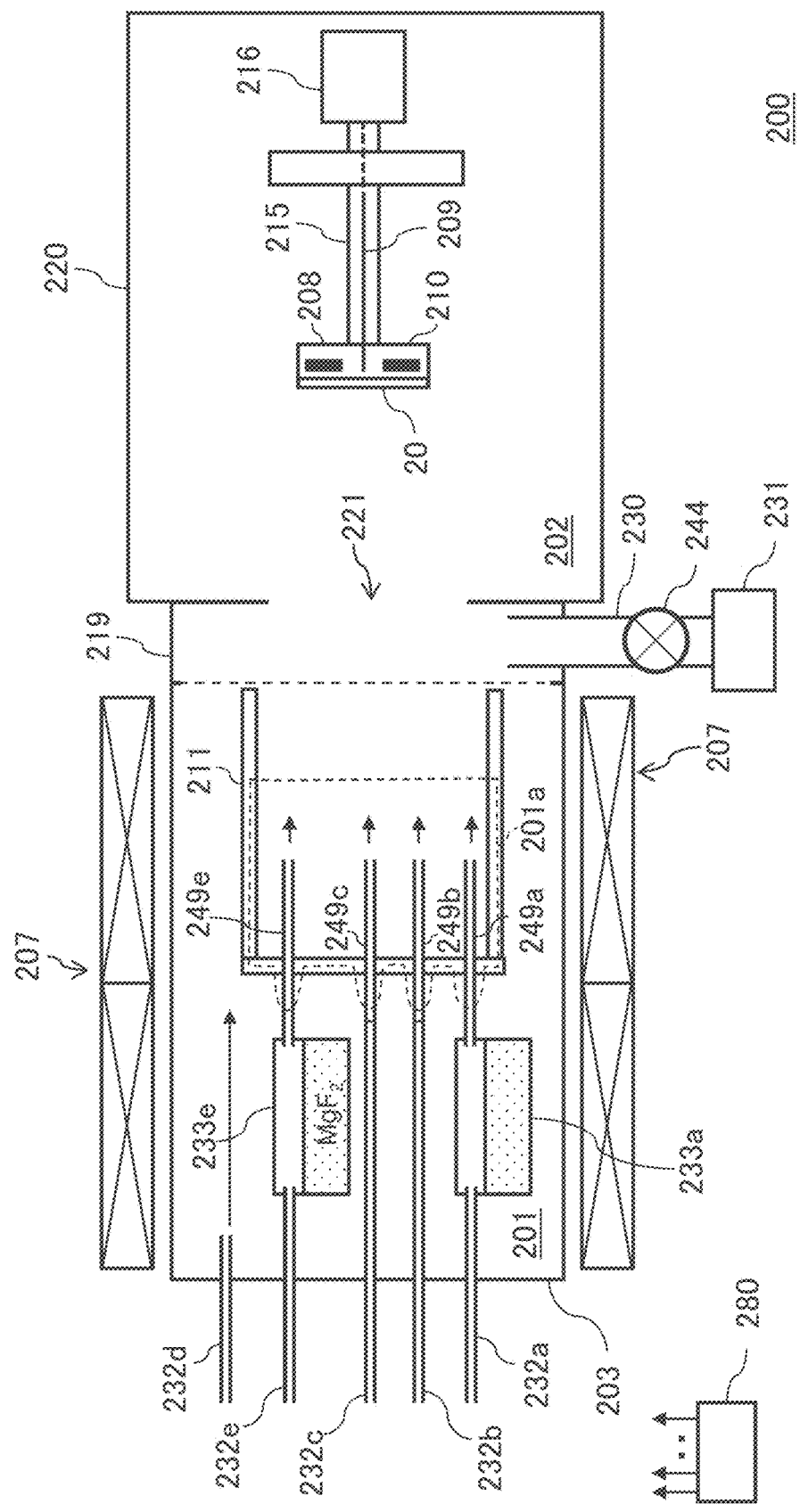

[Fig. 4]
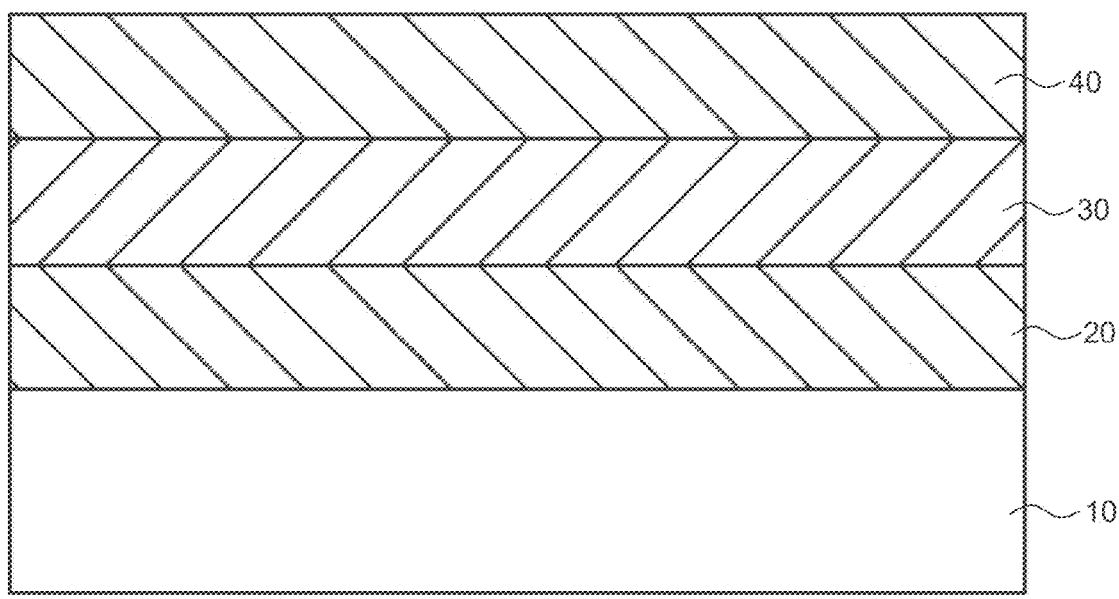

[Fig. 5]
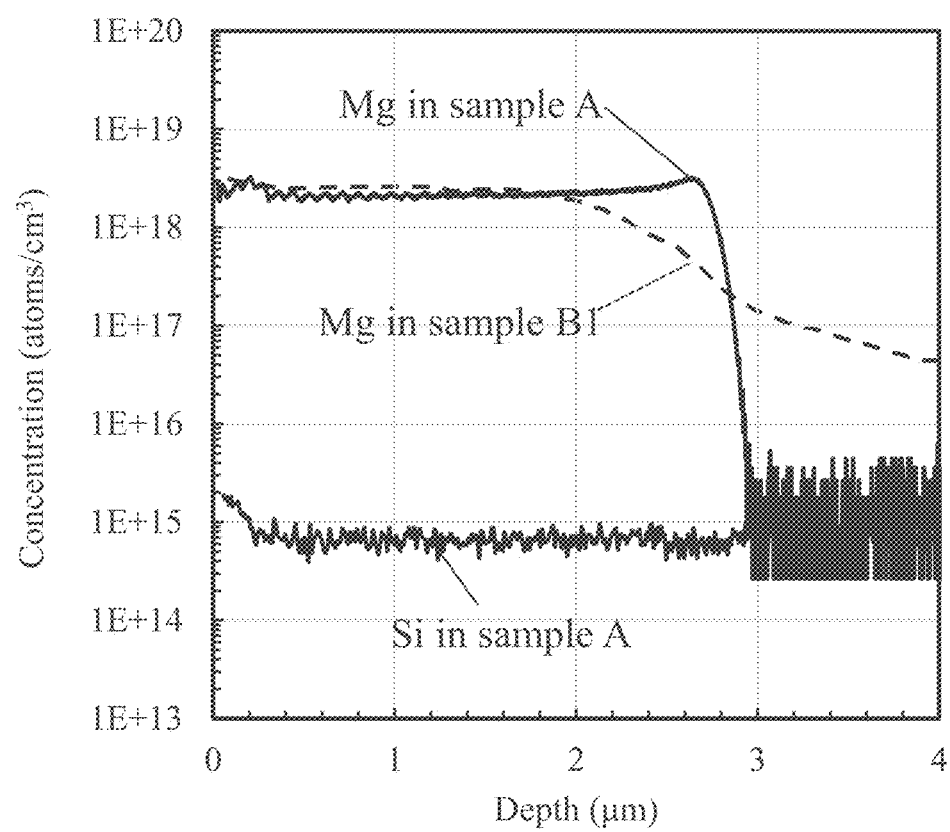

[Fig. 6]
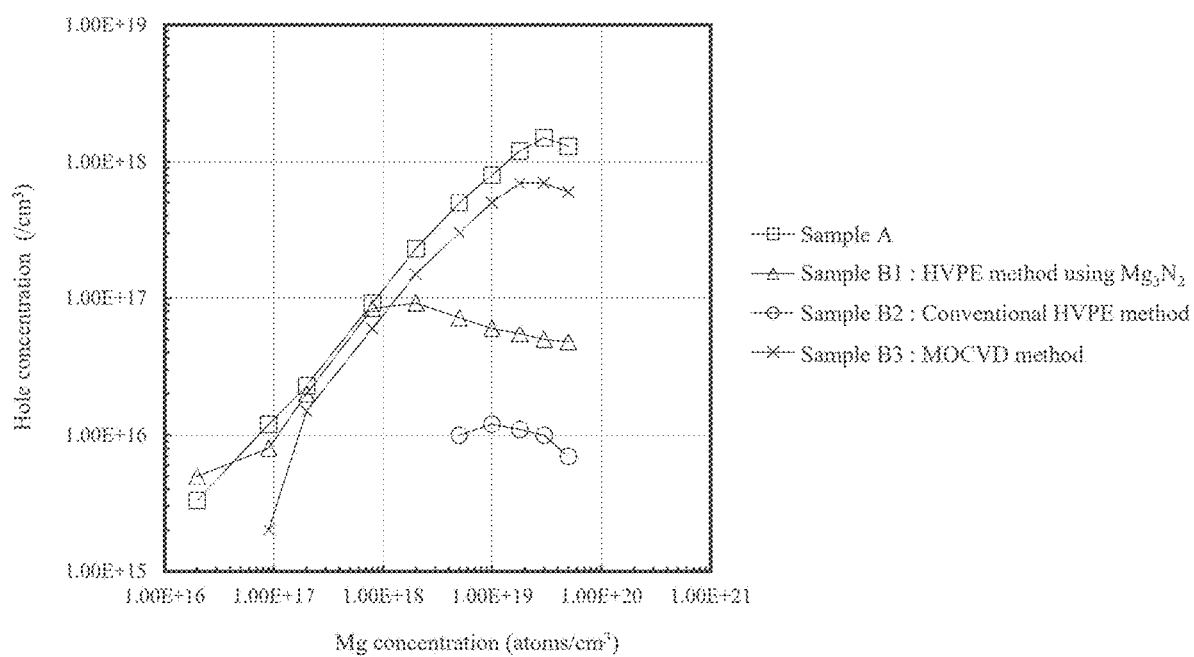

[Fig. 7]
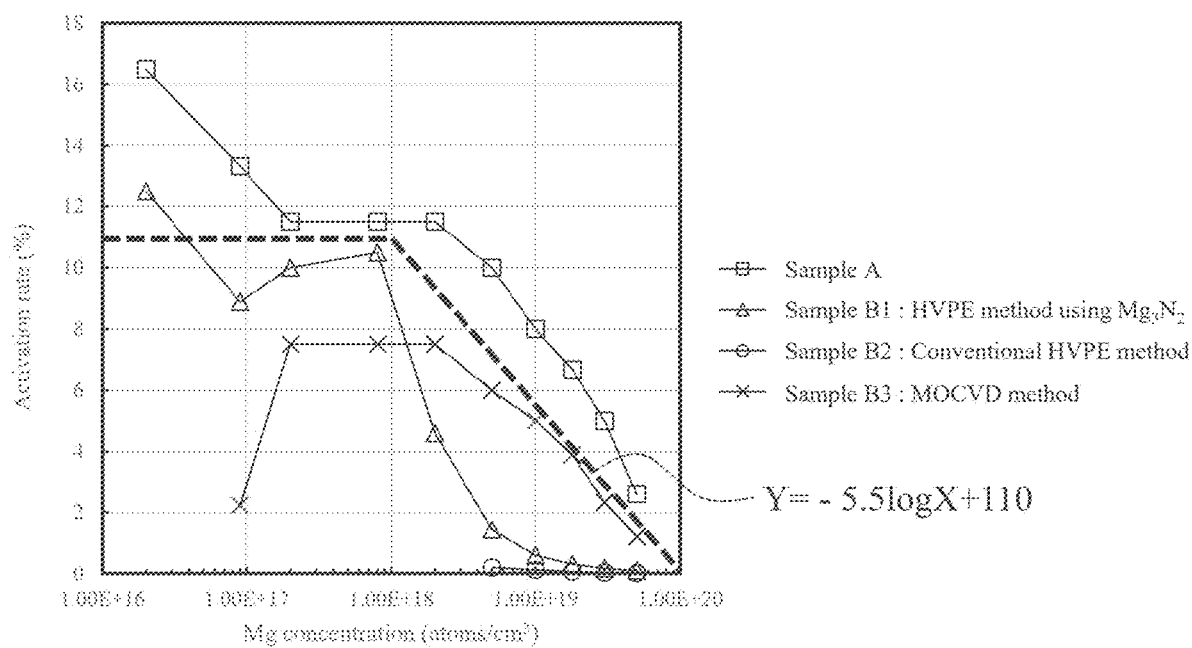

SEMICONDUCTOR LAMINATE AND METHOD FOR MANUFACTURING SEMICONDUCTOR LAMINATE

BACKGROUND

Technical Field

The present disclosure relates to a semiconductor laminate and a method for manufacturing a semiconductor laminate.

Description of Related Art

Various methods have been disclosed as a manufacturing method for obtaining p-type group III nitride crystals (eg, Patent Documents 1 and 2, and Non-Patent Document 1).

[Patent Document 1] International Publication No. 2008/117750

[Patent Document 2] International Publication No. 2004/061923

[Non-Patent Document] Y. Mori et al.: Japanese Journal of Applied Physics 58, SC0803 (2019)

SUMMARY OF THE DISCLOSURE

An object of the present disclosure is to obtain a high-quality semiconductor laminate having a p-type layer.

According to an aspect of the present disclosure, there is provided a semiconductor laminate, including:
- a substrate; and
- a p-type layer provided above the substrate and comprising a group III nitride containing Mg, wherein
- C concentration in the p-type layer is less than $5 \times 10^{15}$ $cm^{-3}$,
- O concentration in the p-type layer is less than $5 \times 10^{15}$ $cm^{-3}$,
- Si concentration in the p-type layer is less than $1 \times 10^{15}$ $cm^{-3}$, and
- F concentration in the p-type layer is $1 \times 10^{14}$ $cm^{-3}$ or more.

According to other aspect of the present disclosure, there is provided a semiconductor laminate, including:
- a substrate;
- a base layer provided on the substrate and comprising a group III nitride; and
- a p-type layer provided above the substrate and comprising a group III nitride containing Mg, wherein
- C concentration in each of the base layer and the p-type layer is less than $5 \times 10^{15}$ $cm^{-3}$,
- O concentration in each of the base layer and the p-type layer is less than $5 \times 10^{15}$ $cm^{-3}$,
- Si concentration in the p-type layer is less than $1 \times 10^{15}$ $cm^{-3}$, and
- a B/A ratio of Mg concentration comparing both sides in the vicinity of an interface between the base layer and the p-type layer is 100 or more,
- wherein the A is Mg concentration at a position 100 nm from the interface toward a base layer in a thickness direction, and
- the B is Mg concentration at a position 100 nm from the interface toward a p-type layer in a thickness direction.

According to further other aspect of the present disclosure, there is provided a method for manufacturing a semiconductor laminate, including:
- preparing a substrate and preparing a hydride vapor phase epitaxy apparatus in which the substrate is housed; and
- growing a p-type layer comprising a group III nitride containing Mg above the substrate by the hydride vapor phase epitaxy apparatus,
- wherein in the growing the p-type layer,
- the p-type layer is doped with Mg by transporting $MgF_2$ while etching it with a halogen-containing gas.

Advantage of the Disclosure

According to the present disclosure, a high-quality semiconductor laminate having a p-type layer can be obtained.

BRIEF DESCRIPTION OF THE DRAWINGS

FIG. 1 is a schematic cross-sectional view illustrating a semiconductor laminate according to a first embodiment of the present invention.

FIG. 2 is a schematic configuration diagram of an HVPE apparatus, illustrating a state in which a crystal growth step is being performed within a reaction vessel.

FIG. 3 is a schematic configuration diagram of the HVPE apparatus, illustrating a state in which a furnace throat of the reaction vessel is opened.

FIG. 4 is a schematic cross-sectional view illustrating a semiconductor laminate according to a second embodiment of the invention.

FIG. 5 is a view illustrating a SIMS depth profile in the semiconductor laminates of Sample A and Sample B1.

FIG. 6 is a graph showing a hole concentration with respect to Mg concentration in semiconductor laminates of Sample A and Samples B1 to B3.

FIG. 7 is a view illustrating Mg activation rate with respect to Mg concentration in the semiconductor laminates of Sample A and Samples B1 to B3.

DETAILED DESCRIPTION OF THE INVENTION

<Finding Acquired by the Inventors>

Conventionally, metal organic chemical vapor deposition (MOCVD) has been mainly used as an industrial growth method for a p-type group III nitride semiconductor.

In the MOCVD method, for example, biscyclopentadienylmagnesium ($Cp_2Mg$) is used as a dopant. Thereby, Mg concentration can be relatively easily controlled. Further, in the MOCVD method, n-type impurities such as silicon (Si) or oxygen (O) that compensate acceptors can be controlled to a low concentration. As a result, a p-type nitride semiconductor grown by the MOCVD method can achieve a wide hole concentration range of $10^{15}$ to $10^{18}$ $cm^{-3}$.

However, in the MOCVD method, it was difficult to suppress the mixing of carbon (C) into the p-type layer due to various organic source gases. Although the hole concentration on an order of $10^{15}$ could be achieved by the MOCVD method, it was difficult to control a low hole concentration due to an influence of carrier compensation by C.

On the other hand, other growth methods involve the following problems.

For example, as an ammonothermal method, Patent Document 2 discloses a technique for suppressing the mixing of impurities such as O that serves as a compensating donor. However, the ammonothermal method is primarily a technique for obtaining a bulk crystal. Therefore, it was difficult to grow a thin film by the ammonothermal method. This is because a phenomenon called meltback, in which GaN melts out in a Ga solution, and growth during a process of temperature rise and pressure rise cannot be ignored. Therefore, in the ammonothermal method, it was difficult to manufacture a laminate having a thin p-type layer. Further, For the same reason as described above, it was difficult to manufacture a laminate having multiple layers.

Further, in the ammonothermal method, due to its process, O as a compensating donor was mixed in a high concentration. Therefore, it has been very difficult to realize a p-type nitride semiconductor having, particularly, a low hole concentration.

For example, as a flux method, Non-Patent Document 1 discloses a technique related to the growth of a laminate having a p-type layer. However, also in the flux method, due to its process, O as a compensating donor was mixed in at a high concentration. Therefore, it has been very difficult to realize a p-type nitride semiconductor having, particularly, a low hole concentration.

For example, in the conventional hydride vapor phase epitaxy method (HVPE method), quartz has been used for a main portion of the epitaxy apparatus. Therefore, in the conventional HVPE method, Si or O originating from quartz is mixed in at a high concentration. Even when a p-type nitride semiconductor is obtained by the HVPE method, Si or O is mixed in as a compensating donor. Therefore, it was difficult to realize a p-type nitride semiconductor having, particularly, a low hole concentration.

Further, in the conventional HVPE method, there is a possibility that a problem caused by dopant occurs.

For example, when using metal Mg as a dopant, metal Mg was placed in a region of about 800° C. in a reaction vessel, and metal Mg was transported to a growth section in a vapor state. At this time, transport of the dopant was difficult because metal Mg reacts with quartz that constitutes a high temperature reaction zone.

For example, when using magnesium oxide (MgO) as a dopant, Mg can be transported relatively easily. However, since O as a compensating donor contained in the dopant is mixed in the crystal, it was difficult to realize a p-type nitride semiconductor having, particularly, a low hole concentration.

For example, when using magnesium nitride ($Mg_3N_2$) as a dopant, Mg can be transported relatively easily. However, since Mg-containing gas is constantly supplied from the $Mg_3N_2$ placed in the reaction vessel, a certain amount of Mg was incorporated during the growth of the non-p-type layer.

Therefore, the present inventors have made intensive studies in order to solve the above-described problem of the p-type nitride semiconductor growth in the conventional manufacturing method. As a result, in addition to a HVPE method technique (JP 2018-070405 A) to obtain a highly pure nitride semiconductor invented by the present inventors, it was found that the hole concentration can be stably controlled over a wide range by using magnesium fluoride ($MgF_2$) as a dopant.

The following embodiments are based on the above finding by the present inventors.

First Embodiment of the Present Invention

A first embodiment of the present invention will be described below with reference to the drawings.

(1) Semiconductor Laminate

A semiconductor laminate 1 according to the present embodiment will be described with reference to FIG. 1. FIG. 1 is a schematic cross-sectional view illustrating a semiconductor laminate according to the present embodiment.

As illustrated in FIG. 1, the semiconductor laminate 1 of the present embodiment is configured as a disk-shaped laminate used when manufacturing a semiconductor device. Specifically, the semiconductor laminate 1 is configured, for example, as a laminate for manufacturing pn junction diode as a semiconductor device.

Specifically, the semiconductor laminate 1 has, for example, a substrate 10, a base layer 20, and a p-type layer 30.

[Substrate]

The substrate 10 comprises a single crystal of a group III nitride semiconductor. The substrate 10 of the present embodiment comprises a single crystal gallium nitride (GaN), for example.

A plane orientation of a main surface (upper surface) of the substrate 10 is, for example, a (0001) plane (+c plane, Ga polar plane). The GaN crystal constituting the substrate 10 may have a predetermined off-angle with respect to the main surface of substrate 10. The off-angle refers to the angle formed by a normal direction of the main surface of substrate 10 and a main axis (c-axis) of the GaN crystal constituting the substrate 10. Specifically, the off-angle of the substrate 10 is, for example, 0° or more and 1.2° or less.

The main surface of the substrate 10 is an epiready surface, and a root mean square roughness (RMS) of the main surface of the substrate 10 is, for example, 10 nm or less, preferably 1 nm or less. "RMS" here means RMS when measuring a 20 μm square area with an atomic force microscope (AFM).

A diameter of the substrate 10 is not particularly limited, but is, for example, 25 mm or more, preferably 50 mm or more, and more preferably 100 mm or more. By setting the diameter of the substrate 10 to 25 mm or more, preferably 50 mm or more, and more preferably 100 mm or more, the productivity of the semiconductor device can be improved.

A thickness of the substrate 10 is, for example, 150 μm or more and 2 mm or less. When the thickness of the substrate 10 is 150 μm or more, a mechanical strength of the substrate 10 can be ensured, to make the substrate 10 freestanding.

A conductivity type of the substrate 10 is not particularly limited, but is, for example, n-type. Examples of n-type impurities in the substrate 10 include silicon (Si) or germanium (Ge). In the present embodiment, for example, the n-type impurity in the substrate 10 is Si, and a Si concentration in the substrate 10 is $1\times10^{18}$ $cm^{-3}$ or more and $3\times10^{20}$ $cm^{-3}$ or less.

[Base Layer]

The base layer 20 is provided on the substrate 10, for example, and has a group III nitride semiconductor. The base layer 20 preferably comprises, for example, a single crystal of the group III nitride semiconductor. The base layer 20 of the present embodiment comprises, for example, a GaN single crystal epitaxially grown by a manufacturing method described later.

A conductivity type of the base layer 20 is not particularly limited, but is, for example, n-type. Examples of the n-type impurities in the base layer 20 include Si and Ge. In the present embodiment, the n-type impurity in the base layer 20 is Si, for example, and a Si concentration in the base layer 20 is, for example, $5\times10^{14}$ $cm^{-3}$ or more and $3\times10^{19}$ $cm^{-3}$ or less. In a MOCVD method, it was difficult to obtain a low free electron concentration because the mixing of C as an impurity was unavoidable as described above. In contrast, in the present embodiment, HVPE method, which will be described later, can stably lower the free electron concentration while lowering the Si concentration in the base layer 20. Thereby, it becomes possible to stably manufacture a semiconductor device having a high breakdown voltage.

In the present embodiment, the concentration of each impurity other than the n-type impurity in the base layer 20 is less than a SIMS measurement limit (lower limit of detection), due to a manufacturing method described later.

Specifically, each of the C concentration and O concentration in the base layer 20 measured by SIMS depth profile analysis, is less than $5 \times 10^{15}$ cm$^{-3}$.

Further, each of iron (Fe) concentration and boron (B) concentration in the base layer 20 measured by SIMS depth profile analysis, is less than $1 \times 10^{15}$ cm$^{-3}$.

Further, since the base layer 20 of the present embodiment is grown by a HVPE method described later, the base layer 20 is not grown by a flux method using an alkali metal such as sodium (Na) or lithium (Li) as a flux. Therefore, the base layer 20 of the present embodiment does not substantially contain alkali metal elements such as Na and Li.

Further, none of arsenic (As), chlorine (Cl), phosphorus (P), fluorine (F), Na, Li, potassium (K), Tin (Sn), titanium (Ti), manganese (Mn), chromium (Cr), molybdenum (Mo), tungsten (W) and nickel (Ni) is detected in the base layer 20 of the present embodiment.

That is, the concentrations of these impurities in the base layer 20 are less than a lower limit of detection by SIMS. A current lower limit of detection for each element by SIMS is as follows.

As : $5 \times 10^{12}$ cm$^{-3}$,

Cl : $1 \times 10^{14}$ cm$^{-3}$,

P : $2 \times 10^{15}$ cm$^{-3}$,

F : $4 \times 10^{13}$ cm$^{-3}$,

Na : $5 \times 10^{11}$ cm$^{-3}$,

K : $2 \times 10^{12}$ cm$^{-3}$,

Sn : $1 \times 10^{13}$ cm$^{-3}$,

Ti : $1 \times 10^{12}$ cm$^{-3}$,

Mn : $5 \times 10^{12}$ cm$^{-3}$,

Cr : $7 \times 10^{13}$ cm$^{-3}$,

Mo : $1 \times 10^{15}$ cm$^{-3}$,

W : $3 \times 10^{16}$ cm$^{-3}$,

Ni : $1 \times 10^{14}$ cm$^{-3}$.

The thickness of the base layer 20 is not particularly limited, but is, for example, 5 μm or more and 200 μm or less. For example, when manufacturing a practical GaN vertical device using the semiconductor laminate 1, the lower the carrier concentration of the base layer 20, the higher the breakdown voltage, and a device with such a higher breakdown voltage can be manufactured. However, as the carrier concentration of the base layer 20 is lower, the device exhibits a lower breakdown voltage than expected from the carrier concentration, due to a phenomenon called punch-through. Therefore, the lower the carrier concentration of the base layer 20, the thicker the base layer 20 needs to be. For example, when the carrier concentration (=Si concentration) of the base layer 20 is a lower limit value of $5 \times 10^{14}$ cm$^{-3}$, the thickness of the base layer 20 needs to be 200 μm.

[p-Type Layer]

The p-type layer 30 is provided, for example, on the base layer 20 (that is, above the substrate 10) and has a group III nitride semiconductor. The p-type layer 30 preferably comprises, for example, a single crystal of the group III nitride semiconductor. The p-type layer 30 of the present embodiment comprises a single crystal of GaN epitaxially grown by the same manufacturing method as that for the base layer 20 except that the p-type layer 30 is doped with a p-type impurity.

The p-type layer 30 contains Mg as a p-type impurity. Mg concentration in the p-type layer 30 is, for example, $1 \times 10^{16}$ cm$^{-3}$ or more and $1 \times 10^{20}$ cm$^{-3}$ or less.

In the present embodiment, by a manufacturing method described later, each concentration of impurities other than Mg and fluorine (F) described later in the p-type layer 30, is less than a measurement limit by SIMS (lower limit of detection).

Specifically, C concentration, O concentration and Si concentration in the p-type layer 30 measured by SIMS depth profile analysis is less than $5 \times 10^{15}$ cm$^{-3}$, $5 \times 10^{15}$ cm$^{-3}$, and $1 \times 10^{15}$ cm$^{-3}$, respectively.

Further, each concentration of Fe and B in the p-type layer 30 measured by SIMS depth profile analysis is, for example, less than $1 \times 10^{15}$ cm$^{-3}$.

Further, the p-type layer 30 of the present embodiment does not substantially contain alkali metal elements such as Na and Li, like the base layer 20. Further, none of the elements among As, Cl, P, Na, Li, K, Sn, Ti, Mn, Cr, Mo, W and Ni is detected in the p-type layer 30 of the present embodiment.

That is, the concentrations of these impurities in the p-type layer 30 are less than a lower limit of detection of SIMS. The current lower limit of detection for each element in SIMS is as follows.

As : $5 \times 10^{12}$ cm$^{-3}$,

Cl : $1 \times 10^{14}$ cm$^{-3}$,

P : $2 \times 10^{15}$ cm$^{-3}$,

Na : $5 \times 10^{11}$ cm$^{-3}$,

K : $2 \times 10^{12}$ cm$^{-3}$,

Sn : $1 \times 10^{13}$ cm$^{-3}$,

Ti : $1 \times 10^{12}$ cm$^{-3}$,

Mn : $5 \times 10^{12}$ cm$^{-3}$,

Cr : $7 \times 10^{13}$ cm$^{-3}$,

Mo : $1 \times 10^{15}$ cm$^{-3}$,

W : $3 \times 10^{16}$ cm$^{-3}$,

Ni : $1 \times 10^{14}$ cm$^{-3}$.

Thus, by suppressing unintended incorporation of these impurities into the p-type layer 30, crystal strain of the p-type layer 30 can be suppressed. Further, by suppressing the incorporation of compensating donors such as Si or O into the p-type layer 30, a particularly low hole concentration in the p-type layer 30 can be stably achieved.

On the other hand, the p-type layer 30 of the present embodiment contains fluorine (F) due to a dopant of Mg in the manufacturing method described below.

Specifically, the F concentration in the p-type layer 30 of the present embodiment is, for example, $1\times10^{14}$ cm$^{-3}$ or more. Thus, by containing a small amount of F in the p-type layer 30, Mg activation rate in the p-type layer 30 can be improved.

The F concentration in the p-type layer 30 of the present embodiment is preferably, for example, $1\times10^{16}$ cm$^{-3}$ or less. Thereby, a carrier passivation due to excessive mixing of F can be suppressed.

Thus, in the present embodiment, since the p-type layer 30 does not contain unnecessary impurities other than Mg and contains a small amount of F, Mg activation rate in the p-type layer 30 is higher than Mg activation rate obtained by the MOCVD method. The "Mg activation rate" here means the ratio of the hole concentration in the p-type layer 30 at room temperature (23° C.) with respect to the Mg concentration in the p-type layer 30.

Specifically, in the present embodiment, when Mg concentration in the p-type layer 30 is less than $1\times10^{18}$ cm$^{-3}$, Mg activation rate in the p-type layer 30 is, for example, 11% or more.

On the other hand, in the present embodiment, when the Mg concentration in the p-type layer 30 is $1\times10^{18}$ cm$^{-3}$ or more, the p-type layer 30 satisfies the following formula (1).

$$Y \geq -5.5 \log X + 110 \quad (1)$$

Wherein, X is Mg concentration in the p-type layer 30 expressed by cm$^{-3}$. Y is the Mg activation rate in the p-type layer 30 expressed by %.

Thus, in the present embodiment, since the p-type layer 30 exhibits a high Mg activation rate, the hole concentration over a wide range can be realized. Specifically, the hole concentration in the p-type layer 30 of the present embodiment can be, for example, $1\times10^{15}$ cm$^{-3}$ or more and $5\times10^{18}$ cm$^{-3}$ or less.

Further, in the present embodiment, by appropriately switching the supply of the Mg-containing gas from a base layer growth step S20 toward a p-type layer growth step S30 by the manufacturing method described later, the Mg concentration changes sharply in the vicinity of an interface between the base layer 20 and the p-type layer 30.

Specifically, the B/A ratio of the Mg concentration comparing both sides in the vicinity of the interface between the base layer 20 and the p-type layer 30 is 100 or more.

Wherein, A is Mg concentration at a position 100 nm from the interface between the base layer 20 and the p-type layer 30 toward the base layer 20 in a thickness direction. B is Mg concentration at a position 100 nm from the interface between the base layer 20 and the p-type layer 30 toward the p-type layer 30 in a thickness direction. The "interface" here means a position where Mg concentration is $10^{\{(\log N_{Max} + \log N_{min})/2\}}$. Here, $N_{Max}$ is a maximum value of the Mg concentration in the base layer 20 and the p-type layer 30. $N_{min}$ is a minimum value of the Mg concentration in base layer 20 and p-type layer 30.

Thus, by setting the B/A ratio of the Mg concentration in the vicinity of the interface between the base layer 20 and the p-type layer 30 to 100 or more, that is, by changing the Mg concentration sharply, a depletion layer width in the pn junction diode can be narrowed.

Further, in the present embodiment, the thickness of the p-type layer 30 obtained by the manufacturing method described later can be thinner than the crystal obtained by the ammonothermal method. Specifically, the thickness of the p-type layer 30 is, for example, 10 nm or more and 5 μm or less, preferably 10 nm or more and 3 μm or less. Since the thickness of the p-type layer 30 is 10 nm or more, the p-type layer 30 can function as a p-type contact layer. On the other hand, since the thickness of the p-type layer 30 is 5 μm or less, deactivation of the p-type layer 30 due to a thick film can be suppressed. Thereby, a vertical device having a p-type layer 30 can function suitably.

In the present embodiment, as will be described later, the base layer 20 and the p-type layer 30 are grown continuously within the same HVPE apparatus 200. Thereby, an unintended high-concentration region of Si or O resulting from impurities in the atmosphere is not formed at the interface between the base layer 20 and the p-type layer 30.

Specifically, a spike-shaped peak having a Si concentration ten times or more higher than the Si concentration at a position 100 nm from the interface between the base layer 20 and the p-type layer 30 toward the base layer 20 in a thickness direction, is not formed between the base layer 20 and the p-type layer 30 in the SIMS depth profile.

A spike-shaped O concentration peak ten times or more higher than the O concentration at a position 100 nm from the interface between the base layer 20 and the p-type layer 30 toward the base layer 20 in a thickness direction, is not formed between the base layer 20 and the p-type layer 30 in the SIMS depth profile.

(2) Method for Manufacturing a Semiconductor Laminate

Hereinafter, a method for manufacturing the semiconductor laminate 1 according to the present embodiment will be specifically described.

The method for manufacturing the semiconductor laminate 1 of the present embodiment includes, for example, a preparation step S10, a base layer growth step S20, a p-type layer growth step S30, and an unloading step S40. Hereinafter, the base layer growth step S20 and the p-type layer growth step S30 are also collectively referred to as a "crystal growth step".

[S10: Preparation Step]

The substrate 10 is prepared first, and the HVPE apparatus 200 in which the substrate 10 is housed, is prepared. The preparation step S10 of the present embodiment includes, for example, an apparatus preparation step S12, a high temperature bake step S14, and a substrate placement step S18. As described below, the high temperature bake step S14 is replaced with a normal bake step S16 in some cases.

(S12: Apparatus Preparation Step)

The following HVPE apparatus 200 is prepared.

The configuration of the HVPE apparatus 200 used for growing GaN crystal will be described in detail with reference to FIG. 2. The HVPE apparatus 200 includes a reaction vessel 203 configured, for example, in a cylindrical shape. The reaction vessel 203 has an airtight structure so that outside atmosphere and gas inside a glove box 220 described later do not enter inside. A reaction chamber 201 in which crystal growth is performed, is formed inside the reaction vessel 203. A susceptor 208 that holds the substrate 10 comprising GaN single crystal, is provided in the reaction chamber 201. The susceptor 208 is connected to a rotating shaft 215 of a rotating mechanism 216 and is rotatable. Further, the susceptor 208 encloses an internal heater 210. The temperature of the internal heater 210 is configured to be controllable separately from a zone heater 207, which will be described later. Further, the susceptor 208 is covered with a heat shield wall 211 on its upstream side and its surrounding. By providing the heat shield wall 211, gases other than gases supplied from nozzles 249a to 249c and 249e, which will be described later, are not supplied to the substrate 10.

The reaction vessel 203 is connected to a glove box 220 via a cylindrical metal flange 219 comprising SUS, etc. The glove box 220 also has an airtight structure so that the atmosphere does not enter inside. The exchange chamber 202 provided inside the glove box 220 is continuously purged with high-purity nitrogen (hereinafter also simply referred to as $N_2$ gas), and is maintained such that oxygen and a moisture concentration are low. The glove box 220 includes: a transparent acrylic wall; multiple rubber gloves connected to holes penetrating this wall; and a pass box for taking things in and out of the glove box 220. The pass box has a vacuum suction mechanism and an $N_2$ purge mechanism, and is configured such that things can be taken in and out of the glove box 220 without drawing oxygen-containing atmosphere into the glove box 220 by replacing the internal atmosphere with $N_2$ gas. When the crystal substrate is taken in and out from the reaction vessel 203, as illustrated in FIG. 3, an opening of the metal flange 219, that is, a furnace throat 221 is opened. Thereby, by performing a high-temperature bake step described later, it is possible to prevent the surfaces of the members in the reaction vessel 203 that have been cleaned and modified from being contaminated again, and possible to prevent the atmosphere and gases containing various impurities from adhering to the surfaces of these members.

A gas supply pipe 232a for supplying hydrogen chloride (HCl) gas into a gas generator 233a, a gas supply pipe 232b for supplying ammonia ($NH_3$) gas into the reaction chamber 201, a gas supply pipe 232c for supplying HCl gas for high-temperature baking and normal baking into the reaction chamber 201, and a gas supply pipe 232d for supplying nitrogen ($N_2$) gas into the reaction chamber 201, are connected to one end of the reaction vessel 203, respectively. The gas supply pipes 232a to 232c are also configured to be capable of supplying hydrogen ($H_2$) gas and $N_2$ gas as carrier gases in addition to HCl gas and $NH_3$ gas. The gas supply pipes 232a to 232c, 232e include a flow controllers and a valve (neither illustrated) for each type of the gas, and are configured so that flow rate control and supply start/stop of various gases can be performed individually for each gas type. Further, the gas supply pipe 232d also includes a flow controller and a valve (neither illustrated). The $N_2$ gas supplied from the gas supply pipe 232d is used to maintain cleanliness of atmosphere in these portions, by purging an upstream side and a surrounding of the heat shield wall 211 in the reaction chamber 201.

The HCl gas supplied from the gas supply pipe 232c and the $H_2$ gas supplied from the gas supply pipes 232a to 232c, act as a cleaning gas that cleans the surfaces of the members inside the reaction chamber 201 (particularly inside the heat shield wall 211), and as a modifying gas that modifies these surfaces into surfaces with a low probability of releasing impurities, in a high temperature bake step and a normal bake step described later. The $N_2$ gas supplied from the gas supply pipes 232a to 232c acts in each bake step, to appropriately adjust the flow rate of the HCl gas and $H_2$ gas ejected from the tips of the nozzles 249a to 249c, so that a desired place inside the reaction chamber 201 (particularly inside the heat shield wall 211) is appropriately cleaned.

The HCl gas introduced from the gas supply pipe 232a acts in a crystal growth step described later, as a reactive gas for generating GaCl gas, that is, Ga source gas which is a halide of Ga by reacting with Ga source. Further, the $NH_3$ gas supplied from the gas supply pipe 232b acts in the crystal growth step described later, as a nitriding agent, that is, as N source gas for growing GaN, which is a nitride of Ga, on the substrate 10, by reacting with GaCl gas. Hereinafter, the GaCl gas and $NH_3$ gas are collectively referred to as a source gas in some cases. The $H_2$ gas and $N_2$ gas supplied from the gas supply pipes 232a to 232c act in a crystal growth step described later, to appropriately adjust a blowing flow rate of the source gas ejected from the tips of the nozzles 249a to 249c, and direct the source gas toward the substrate 10.

As described above, the gas generator 233a in which the Ga melt as the Ga source is housed, is provided on the downstream side of the gas supply pipe 232a. A nozzle 249a for supplying GaCl gas generated by the reaction between HCl gas and Ga melt toward the main surface of substrate 10 held on susceptor 208, is provided on the gas generator 233a. Nozzles 249b and 249c for supplying various gases supplied from these gas supply pipes toward the main surface of the substrate 10 held on the susceptor 208, are provided on the downstream side of the gas supply pipes 232b and 232c. Each of the nozzles 249a to 249c is configured to pass through the upstream side of the heat shield wall 211.

The gas supply pipe 232c is also configured to be capable of supplying Si-containing gases such as silane ($SiH_4$) gas and dichlorosilane ($SiH_2Cl_2$) as dopant gases in addition to HCl gas, $H_2$ gas, and $N_2$ gas.

Further, in the present embodiment, a gas supply pipe 232e for supplying a halogen-containing gas into a gas generator 233e, which will be described later, is connected to one end of the reaction vessel 203. The halogen-containing gas is a gas capable of etching $MgF_2$, which will be described later, and examples thereof include HCl gas, HF gas, and $CH_3F$. The gas supply pipe 232e is configured to be capable of supplying $H_2$ gas and $N_2$ gas as carrier gases in addition to the halogen-containing gas. The gas supply pipe 232e includes a flow rate controller and a valve (neither illustrated) for each type of these gases, and is configured so that flow rate control and supply start/stop of various gases can be performed individually for each gas type.

A gas generator 233e containing $MgF_2$ as an Mg dopant is provided on the downstream side of the gas supply pipe 232e. The halogen-containing gas introduced from the gas supply pipe 232e to the gas generator 233e acts in a p-type layer growth step S30 described later, to transport $MgF_2$ while etching it. On the other hand, even when the gas generator 233e is heated, almost no Mg-containing gas is generated unless the halogen-containing gas is supplied.

A nozzle 249e for supplying the Mg-containing gas transported while etching $MgF_2$ by halogen-containing gas toward the main surface of the substrate 10 held on the susceptor 208, is provided on the gas generator 233e. The nozzle 249e is configured to pass through the upstream side of the heat shield wall 211.

The $H_2$ gas supplied from the gas supply pipe 232e acts in the p-type layer growth step S30 described later, to appropriately adjust the blowing flow rate of the source gas ejected from the tip of the nozzle 249e, and direct the source gas toward the substrate 10. The $H_2$ gas supplied from the gas supply pipe 232e can also act as a cleaning gas and a modifying gas in a high temperature bake step and a normal bake step described later, similarly to the $H_2$ gas supplied from the gas supply pipes 232a to 232c described above.

An exhaust pipe 230 for exhausting an inside of the reaction chamber 201, is provided to a metal flange 219 provided at the other end of the reaction vessel 203. An APC valve 244 as a pressure regulator and a pump 231 are provided on the exhaust pipe 230 sequentially from an upstream side. A blower including a pressure regulation mechanism can also be used instead of the APC valve 244 and the pump 231.

A zone heater 207 for heating the inside of the reaction chamber 201 to a desired temperature, is provided on an outer circumference of the reaction vessel 203. The zone heater 207 incudes at least two heaters, a portion including the gas generators 233a and 233e on the upstream side and a portion including the susceptor 208 on the downstream side, and each heater has a temperature sensor and a temperature controller (neither illustrated) so that each heater can individually adjust a temperature within a range of a room temperature to 1200° C.

Further, the susceptor 208 holding the substrate 10 includes an internal heater 210, a temperature sensor 209 and a temperature controller (not illustrated) as described above, separately from the zone heater 207, so that the temperature can be adjusted at least in a range of a room temperature to 1600° C. Further, the upstream side and the surrounding of the susceptor 208 are surrounded by the heat shield wall 211 as described above. At least the surface (inner peripheral surface) of the heat shield wall 211 facing the susceptor 208 must be made of a limited material that does not generate impurities, as will be described later. However, as for the other surface (peripheral surface), there is no limitation on the material used as long as it is a material that can withstand a temperature of 1600° C. or higher. A portion of the heat shield wall 211 excluding at least an inner peripheral surface is made of, for example, a highly heat-resistant nonmetallic material such as carbon or silicon carbide (SiC), or a highly heat-resistant metal material such as Mo or W, and can have a configuration in which a plate-like reflector is laminated. With this configuration, the temperature outside the heat shield wall 211 can be suppressed to 1200° C. or less even when the temperature of the susceptor 208 is 1600° C. Since this temperature is below a softening point of quartz, with this configuration, quartz can be used as each member constituting the reaction vessel 203, the gas generator 233a, the gas generator 233e, and the upstream portion of the gas supply pipes 232a to 232e.

Here, the reaction chamber 201 has a high temperature reaction zone 201a which is heated to a crystal growth temperature (900° C. or higher) of the group III nitride in the crystal growth step described later, and is contact with the gas supplied to the substrate 10.

In the present embodiment, at least the surface of the member constituting the high temperature reaction zone 201a is made of, for example, a quartz ($SiO_2$)-free and B (boron)-free material, and has heat resistance of at least 1600° C.

Specifically, an inner wall of the heat shield wall 211 on the upstream side of the susceptor 208, a portion of the nozzles 249a to 249c, 249e passing through the inside of the heat shield wall 211, a portion outside the heat shield wall 211 heated to 900° C. or higher in the crystal growth step, a surface of the susceptor 208, etc. are made of a heat-resistant material such as alumina ($Al_2O_3$), SiC, graphite, pyrolytic graphite, etc. Although not included in the high temperature reaction zone 201a, it goes without saying that the portion surrounding the internal heater 210 is also required to have a heat resistance of at least 1600° C. The reason why such a high heat resistance is required for the members constituting the high temperature reaction zone 201a is that the high-temperature bake step is performed before the crystal growth step, as will be described later.

Each member provided in the HVPE apparatus 200, for example, various valves and flow controllers provided in the gas supply pipes 232a to 232e, the pump 231, the APC valve 244, the zone heater 207, the internal heater 210, the temperature sensor 209, etc., are connected to a controller 280 configured as a computer.

Next, an example of processing using the HVPE apparatus 200 described above will be described in detail with reference to FIG. 2. In the following description, the controller 280 controls an operation of each unit that constitutes the HVPE apparatus 200.

(S14: High Temperature Bake Step)

This step is performed when the inside of the reaction chamber 201 or the inside of the exchange chamber 202 is exposed to the atmosphere by performing maintenance of the HVPE apparatus 200, introduction of Ga source into the gas generator 233a, introduction of $MgF_2$ into the gas generator 233e, etc. Before performing this step, it is confirmed that the reaction chamber 201 and the exchange chamber 202 are airtight. After the airtightness is confirmed, the inside of the reaction chamber 201 and the inside of the exchange chamber 202 are replaced with $N_2$ gas, then, the insides of these chambers are set in a state of low oxygen and moisture, then, the surfaces of various members that constitute the reaction chamber 201 are heat-treated, with the inside of the reaction vessel 203 set in a predetermined atmosphere. This processing is performed in a state where the substrate 10 is not loaded into the reaction vessel 203, and in a state where the Ga source is introduced into the gas generator 233a and the $MgF_2$ is introduced into the gas generator 233e.

In this step, the temperature of the zone heater 207 is adjusted to the same temperature as the temperature in the crystal growth step. Specifically, the temperature of the upstream side heater including the gas generators 233a and 233e is set to a temperature of 700 to 900° C., and the temperature of the downstream side heater including the susceptor 208 is set to 1000 to 1200° C. Further, the temperature of the internal heater 210 is set to a predetermined temperature of 1500° C. or higher. As will be described later, in the crystal growth step, the internal heater 210 is turned off or set to a temperature of 1200° C. or less, so the temperature of the high temperature reaction zone 201a is 900° C. or more and less than 1200° C. On the other hand, in the high temperature bake step, by setting the temperature of the internal heater 210 to a temperature of 1500° C. or higher, the temperature of the high temperature reaction zone 201a becomes 1000 to 1500° C. or higher, and the temperature of the vicinity of the susceptor 208 on which the substrate 10 is placed, reaches 1500° C. or higher. As for other positions, the temperature at each position is at least 100° C. higher than the temperature during the crystal growth step. In the high temperature reaction zone 201a, the portion where the temperature is the lowest 900° C., specifically, the portion on the upstream side of the nozzles 249a to 249c, 249e inside the heat shield wall 211, are the portions where adhered impurity gas is most hardly removed. By setting the temperature of the internal heater 210 to a temperature of 1500° C. or higher so that the temperature of this portion is at least 1000° C. or higher, the effect of the cleaning and modifying treatment described later, that is, the effect of reducing impurities in the grown GaN crystal, can be sufficiently obtained. When the temperature of the internal heater 210 is less than 1500° C., the temperature at any point in the high temperature reaction zone 201a cannot be sufficiently increased, and it becomes difficult to obtain the effect of the cleaning and modifying treatment described later, that is, the effect of reducing impurities in the GaN crystal.

An upper limit of the temperature of the internal heater 210 in this step depends on a performance of the heat shield wall 211. That is, as long as the temperature of the quartz part, etc., outside the heat shield wall 211 can be suppressed to a range that does not exceed their heat resistance temperature, the higher the temperature of the internal heater 210, the easier it is to obtain the effect of cleaning and modifying treatment, which will be described later. When the temperature of the quartz part, etc., outside the heat shield wall 211 exceeds their heat resistance temperature, a maintenance frequency and a cost of the HVPE apparatus 200 may increase.

Further, in this step, after the temperatures of the zone heater 207 and the internal heater 210 reach a predetermined temperature described above, $H_2$ gas is supplied at a flow rate of about 3 slm, for example, from each of the gas supply pipes 232a, 232b, and 232e. It should be noted that no HCl gas is supplied from the gas supply pipe 232a, and no halogen-containing gas is supplied from the gas supply pipe 232e. Further, HCl gas is supplied from the gas supply pipe 232c at a flow rate of about 2 slm, for example, and $H_2$ gas is supplied from the gas supply pipe 232c at a flow rate of about 1 slm, for example. Further, $N_2$ gas is supplied from the gas supply pipe 232d at a flow rate of about 10 slm, for example. Then, by maintaining this state for a predetermined period of time, the inside of the reaction chamber 201 is baked. By starting the supply of $H_2$ gas and HCl gas at the timing described above, that is, after raising the temperature of the inside of the reaction chamber 201, it is possible to reduce an amount of gas that flows unnecessarily without contributing to the cleaning and modifying treatment described later, and to reduce a processing cost of crystal growth.

Further, in this step, with the pump 231 operated, and at that time, by adjusting the opening of the APC valve 244, the pressure inside the reaction vessel 203 is maintained at, for example, 0.5 atm or more and 2 atm or less. By performing this step while the reaction vessel 203 is being evacuated, it is possible to efficiently remove impurities from the inside of the reaction vessel 203, that is, clean the inside of the reaction vessel 203. When the pressure in the reaction vessel 203 is less than 0.5 atm, it becomes difficult to obtain the effect of the cleaning and modifying treatment described later. Further, when the pressure in the reaction vessel 203 exceeds 2 atm, etching damage to the members inside the reaction chamber 201 becomes excessive.

Further, in this step, a partial pressure ratio of HCl gas to $H_2$ gas (HCl partial pressure/$H_2$ partial pressure) in the reaction vessel 203 is set to, for example, 1/50 to 1/2. When the above-described partial pressure ratio is less than 1/50, it becomes difficult to obtain the effect of the cleaning and modifying treatment, which will be described later. Further, when the above-described partial pressure ratio is larger than 1/2, the etching damage to the members in the reaction chamber 201 becomes excessive. Such a partial pressure control can be performed by adjusting the flow rate by flow controllers provided in the gas supply pipes 232a to 232e.

By performing this step for, for example, 30 minutes or more and 300 minutes or less, in the reaction chamber 201, at least the surfaces of various members that constitute the high temperature reaction zone 201a can be cleaned to remove foreign matters adhering to these surfaces. Then, by keeping the surfaces of these members 100° C. or higher than the temperature in the crystal growth step described later, the release of impurity gases from these surfaces is promoted, and under such temperature and pressure conditions in the crystal growth step, the surface can be modified so that impurities such as Si, B, Fe, O and C are less likely to be released. When the execution time of this step is less than 30 minutes, the effect of the cleaning and modifying treatment described here may be insufficient. Further, when the execution time of this step exceeds 300 minutes, the members constituting the high temperature reaction zone 201a are excessively damaged.

When $H_2$ gas and HCl gas are supplied into the reaction vessel 203, $NH_3$ gas is not supplied into the reaction vessel 203. When $NH_3$ gas is supplied into the reaction vessel 203 in this step, it becomes difficult to obtain the effect of the above-described cleaning and modifying treatment, particularly the effect of the modifying treatment.

Further, when supplying $H_2$ gas and HCl gas into the reaction vessel 203, a halogen-based gas such as chlorine ($Cl_2$) gas may be supplied instead of HCl gas. Also in this case, the effect of the above-described cleaning and modifying treatment can be similarly obtained.

Further, when $H_2$ gas and HCl gas are supplied into the reaction vessel 203, $N_2$ gas may be added as a carrier gas from the gas supply pipes 232a to 232c. By adjusting the blowing flow rate of the gas from the nozzles 249a to 249c by adding $N_2$ gas, it is possible to prevent an occurrence of imperfect portions in the cleaning and modifying treatment described above. A rare gas such as Ar gas or He gas may be supplied instead of $N_2$ gas.

When completing the cleaning and modifying treatment described above, an output of the zone heater 207 is lowered to decrease the temperature inside the reaction vessel 203 to, for example, 200° C. or less, that is, lowered to a temperature at which the substrate 10 can be loaded into the reaction vessel 203. Further, the supply of $H_2$ gas and HCl gas into the reaction vessel 203 is stopped, and the inside the reaction vessel 203 is purged with $N_2$ gas. When purging the inside of the reaction vessel 203 is completed, the opening of the APC valve 244 is adjusted so that the pressure inside the reaction vessel 203 is an atmospheric pressure or a pressure slightly higher than the atmospheric pressure, while maintaining the supply of $N_2$ gas into the reaction vessel 203.

(S16: Normal Bake Step)

The high temperature bake step S14 described above is performed when the inside of the reaction chamber 201 or the inside of the exchange chamber 202 is exposed to the atmosphere. However, when performing the crystal growth step, normally, the inside of the reaction chamber 201 and the inside of the exchange chamber 202 are not exposed to the atmosphere, including before and after the crystal growth step, so the high temperature bake step S14 is not necessary. However, by performing the crystal growth step, polycrystals of GaN adhere to the surfaces of the nozzles 249a to 249c and 249e, the surface of the susceptor 208, the inner wall of the heat shield wall 211, etc. When the next crystal growth step is performed with polycrystals of GaN remaining, GaN polycrystalline powder, Ga droplets, etc., which are separated from the polycrystal and scattered, adhere to the substrate 10 and become a cause of a hindrance to a good crystal growth. Therefore, after the crystal growth step, a normal bake step S16 is performed for the purpose of removing the above-described GaN polycrystals. The processing procedure and processing condition in the normal bake step can be the same as those in the high temperature bake step S14, except that the internal heater 210 is turned off and the temperature in the vicinity of the susceptor 208 is set to 1000 to 1200° C. The GaN polycrystal can be removed from the reaction chamber 201 by performing the normal bake step S16.

(S18: Substrate Placement Step)

When the cooling and purging inside of the reaction vessel 203 are completed after performing the high temperature bake step S14 or the normal bake step S16, a substrate placement step S18 is performed so that the substrate 10 is housed in the reaction vessel 203.

As illustrated in FIG. 3, the furnace throat 221 of the reaction vessel 203 is opened, and the substrate 10 is placed on the susceptor 208. The furnace throat 221 is isolated from the atmosphere and connected to the glove box 220 which is continuously purged with $N_2$ gas. The glove box 220, as described above, includes: a transparent acrylic wall; multiple rubber gloves connected to the holes penetrating this wall; and a pass box for taking things in and out of the glove box 220. By replacing the atmosphere inside the pass box with $N_2$ gas, things can be taken in and out of the glove box 220 without drawing air into the glove box 220. By performing the operation of placing the substrate 10 using such a mechanism, it is possible to prevent re-contamination of each member in the reaction vessel 203 that has been cleaned and modified by performing the high temperature bake step S14, and possible to prevent a redeposition of impurity gas to these members. The surface of the substrate 10 placed on the susceptor 208, that is, the main surface (crystal growth surface, base surface) facing the nozzles 249a to 249c Is, for example, a (0001) plane of the GaN crystal, that is, a +c plane (Ga polar plane).

[S20: Base Layer Growth Step]

When the substrate 10 is completely housed in the reaction chamber 201, the HVPE apparatus 200 is used to perform the following base layer growth step S20.

After loading the substrate 10 into the reaction chamber 201, the furnace throat 221 is closed, and supply of $H_2$ gas or $H_2$ gas and $N_2$ gas into the reaction chamber 201 is started, while the inside of the reaction chamber 201 is being heated and evacuated. Then, when the temperature and pressure inside of the reaction chamber 201 reaches a desired processing temperature and pressure to obtain a desired atmosphere in the reaction chamber 201, supply of HCl gas and $NH_3$ gas from the gas supply pipes 232a and 232b is started, and GaCl gas and $NH_3$ gas are supplied to the surface of the substrate 10, respectively. At this time, $SiH_2Cl_2$ is supplied to the surface of the substrate 10 from the gas supply pipe 232c. Halogen-containing gas is not supplied from the gas supply pipe 232e so as not to generate Mg-containing gas. In this manner, the base layer 20 comprising n-type GaN single crystal can be grown on the substrate 10.

In this step, in order to prevent a thermal decomposition of the GaN crystal constituting the substrate 10, it is preferable to start supply of $NH_3$ gas into the reaction chamber 201 at the timepoint when the temperature of the substrate 10 reaches 500° C. or before this timepoint. Further, in order to improve an in-plane film thickness uniformity, etc., of the base layer 20 and the p-type layer 30, the crystal growth step including the p-type layer growth step S30, which will be described later, is preferably performed while the susceptor 208 is being rotated.

In this step, as for the temperature of the zone heater 207, the temperature of the upstream side heater including the gas generator 233a is preferably set to a temperature of 700 to 900° C., and the temperature of the downstream side heater including the susceptor 208 is preferably set to a temperature of 1000 to 1200° C. Thereby, the temperature of the susceptor 208 is adjusted to a predetermined crystal growth temperature of 1000 to 1200° C. In this step, the internal heater 210 may be used in an off state, but as long as the temperature of the susceptor 208 is within a range of 1000 to 1200° C., temperature control using the internal heater 210 may be performed.

Other processing conditions of this step are exemplified below.

Processing pressure: 0.5 to 2 atm
GaCl gas partial pressure: 0.1 to 20 kPa
$NH_3$ gas partial pressure/GaCl gas partial pressure: 1 to 100
$H_2$ gas partial pressure/GaCl gas partial pressure: 0 to 100
Partial pressure of $SiH_2Cl_2$ gas: 0.1 to 10 Pa When the growth of the base layer 20 is completed, supply of $SiH_2Cl_2$ from the gas supply pipe 232c is stopped.

[S30: P-Type Layer Growth Step]

When the base layer growth step S20 is completed, the HVPE apparatus 200 is still used to grow the p-type layer 30 comprising single crystal GaN containing Mg, on the base layer 20.

Specifically, by continuing to supply HCl gas and $NH_3$ gas from the gas supply pipes 232a and 232b, GaCl gas and $NH_3$ gas are supplied to the surface of the substrate 10, respectively.

At this time, in the present embodiment, by supplying HCl gas as a halogen-containing gas from the gas supply pipe 232e and transporting $MgF_2$ in the gas generator 233e while etching $MgF_2$, the p-type layer 30 is doped with Mg.

At this time, the partial pressure of HCl gas as the halogen-containing gas from the gas supply pipe 232e is, for example, 1 Pa or more and 1 kPa or less. In the p-type layer growth step S30, conditions other than the partial pressure of the halogen-containing gas from the gas supply pipe 232e are the same as those in the base layer growth step S20.

In this manner, by growing the p-type layer 30 using the HVPE apparatus 200 described above, a predetermined amount of Mg and a small amount of F can be incorporated into the p-type layer 30 while suppressing incorporation of impurities other than Mg and F into the p-type layer 30. Further, by using $MgF_2$ as a dopant, only the p-type layer 30 can be selectively doped with Mg.

The above steps from the base layer growth step S20 to the p-type layer growth step S30 are continuously performed in the same HVPE apparatus 200 without exposing the substrate 10 to the atmosphere. Thereby, it is possible to suppress an unintentional formation of a high-concentration region of Si or O (a region having relatively higher Si concentration or O concentration than the base layer 20 and the p-type layer 30) due to impurities in the air, at the interface between the base layer 20 and the p-type layer 30.

[S40: Unloading Step]

When the base layer 20 and the p-type layer 30 are grown in this order on the substrate 10, supply of HCl gas and $H_2$ gas into the reaction chamber 201 and heating by the zone heater 207 are stopped, while supplying $NH_3$ gas and $N_2$ gas into the reaction chamber 201, in a state where the inside of the reaction chamber 201 is evacuated. Then, when the temperature in the reaction chamber 201 is decreased to 500° C. or lower, supply of $NH_3$ gas is stopped and the atmosphere in the reaction chamber 201 is replaced with $N_2$ gas to return to atmospheric pressure. Then, the temperature inside of the reaction chamber 201 is decreased to a temperature of, for example, 200° C. or less, that is, a temperature at which the semiconductor laminate 1 can be unloaded from the inside of the reaction vessel 203. Thereafter, the semiconductor laminate 1 is unloaded from the reaction chamber 201 through the glove box 220 and the pass box.

As described above, the semiconductor laminate 1 of the present embodiment is manufactured.

When manufacturing a plurality (n pieces) of semiconductor laminates 1, for example, the processing order is preferably: the inside of the reaction chamber 201 and the inside of the exchange chamber 202 are exposed to the atmosphere→high temperature bake step S14→crystal growth step→unloading step S40→(normal bake step S16→crystal growth step→unloading step S40)×(n−1), in this order.

(3) Effects Obtained by the Present Embodiment

According to the present embodiment, one or more of the following effects are obtained.
(a) According to the present embodiment, in the manufacturing method described above, by growing the p-type layer 30 in the cleaned and modified high temperature reaction zone 201a while suppressing the release of impurities such as C, Si and O from the high temperature reaction zone 201a, the unintended incorporation of these impurities into the p-type layer 30 can be suppressed. Thereby, crystal strain of the p-type layer 30 can be suppressed. Further, by suppressing the incorporation of compensating impurities such as C, Si or O into the p-type layer 30, a particularly low hole concentration in the p-type layer 30 can be achieved.
(b) According to the present embodiment, the HVPE method is used in the p-type layer growth step S30 as follows: by using $MgF_2$ as a dopant, and transporting $MgF_2$ while etching it with halogen-containing gas, the p-type layer 30 is doped with Mg.

By using the HVPE method and not using an organic source gas, the mixing of C into the p-type layer 30 can be suppressed. Thereby, carrier compensation caused by C as an impurity can be suppressed. As a result, a high Mg activation rate at a low Mg concentration that could not be obtained by the MOCVD method, can be achieved. That is, a low hole concentration can be stably controlled.

Further, by using $MgF_2$ that does not contain O as the Mg dopant, incorporation of O as a compensating donor into the p-type layer 30 can be suppressed. Thereby, a multiplier effect with the effect of suppressing the compensating donor derived from the HVPE apparatus described above, can be obtained. That is, even when the HVPE method is used, a low hole concentration in the p-type layer 30 can be stably achieved.

Further, by using $MgF_2$ as a dopant, the p-type layer 30 can be doped with Mg while incorporating a small amount of F derived from the dopant into the p-type layer 30. Thereby, the Mg activation rate in the p-type layer 30 can be improved. Although a detailed mechanism of this effect is not known, it is believed that the crystal strain of the p-type layer 30 can be relaxed by the p-type layer 30 containing F. Thereby, a high Mg activation rate at a high Mg concentration that could not be obtained by a conventional manufacturing method, can be achieved. As a result, the p-type layer 30 having a high hole concentration can be obtained.

In this manner, by incorporating a predetermined amount of Mg and a small amount of F into the p-type layer 30 while suppressing incorporation of a compensating donor into the p-type layer 30, the hole concentration over a wide range can be obtained in the p-type layer 30. That is, a high-quality semiconductor laminate 1 including the p-type layer 30 can be obtained.

(c) In the present embodiment, $MgF_2$ is used as a dopant, and Mg doping is controlled by supplying a halogen-containing gas that has an etching action on $MgF_2$. By such Mg doping control, only the p-type layer 30 can be selectively doped with Mg while suppressing Mg from mixing into the base layer 20 as a non-p-type layer. Thereby, the Mg concentration can be changed sharply in the vicinity of the interface between the base layer 20 and the p-type layer 30. Specifically, the B/A ratio of the Mg concentration in the vicinity of the interface between the base layer 20 and the p-type layer 30 can be 100 or more.

In this manner, by changing the Mg concentration sharply, a depletion layer width in the pn junction diode can be narrowed. Thereby, a recombination probability during current diffusing in ON state can be reduced. As a result, the loss in the pn junction diode can be reduced.

Further, a doping profile of Mg as designed can be realized. Thereby, a device design with a high degree of freedom becomes possible.

Second Embodiment of the Present Invention

Next, a second embodiment of the present invention will be described. In the first embodiment described above, the case where the semiconductor laminate 1 has the base layer 20 and the p-type layer 30 on the substrate 10 in this order, has been described. However, a configuration of the semiconductor laminate 1 may be changed as in the following embodiment.

Hereinafter, only elements different from the above-described embodiment will be described, and elements that are substantially the same as those described in the above-described embodiment will be given the same reference numerals, and descriptions thereof will be omitted.

(1) Semiconductor Laminate

The semiconductor laminate 1 according to the present embodiment will be described with reference to FIG. 4. FIG. 4 is a schematic cross-sectional view illustrating a semiconductor laminate according to the present embodiment.

As illustrated in FIG. 4, the semiconductor laminate 1 of the present embodiment is configured as a laminate for manufacturing a vertical field effect transistor (FET) having, for example, a trench gate structure (npn structure). Specifically, the semiconductor laminate 1 has, for example, a substrate 10, a base layer 20, a p-type layer 30 and an upper layer 40.

[Upper Layer]

The upper layer 40 is provided on the p-type layer 30, for example, and has a group III nitride semiconductor. The upper layer 40 is preferably comprises, for example, a group III nitride semiconductor single crystal. The upper layer 40 of the present embodiment comprises, for example, a GaN single crystal epitaxially grown by the same manufacturing method as that of the base layer 20 described above.

The conductivity type of the upper layer 40 is, for example, n-type, and the Si concentration in the upper layer 40 is, for example, the same as the Si concentration in the base layer 20.

In the present embodiment, by the above-described manufacturing method, the concentrations of impurities other than the n-type impurities in the upper layer 40 are below the SIMS measurement limit (lower limit of detection), similarly to the base layer 20.

Specifically, each of the C concentration and O concentration in the upper layer 40 measured by SIMS depth profile analysis is less than $5\times10^{15}$ $cm^{-3}$. Further, each of the Fe concentration and B concentration in the upper layer 40 measured by SIMS depth profile analysis is less than $1\times10^{15}$ cm$^{-3}$. Further, concentrations of As, Cl, P, Na, Li, K, Sn, Ti, Mn, Cr, Mo, W and Ni in the upper layer 40 are also the same as those in the base layer 20.

Further, in the present embodiment, by appropriately stopping the supply of the Mg-containing gas from the p-type layer growth step S30 toward the upper layer growth step, the Mg concentration changes sharply in the vicinity of the interface between p-type layer 30 and upper layer 40.

Specifically, the D/E rate of the Mg concentration comparing both sides in the vicinity of the interface between the p-type layer 30 and the upper layer 40, is 100 or more.

Wherein, D is Mg concentration at a position 100 nm from the interface between the p-type layer 30 and the upper layer 40 toward the p-type layer 30 in a thickness direction, and E is Mg concentration at a position 100 nm from the interface between the p-type layer 30 and the upper layer 40 toward the upper layer 40 in a thickness direction. The definition of the "interface" is similar to the above-mentioned definition of the "interface", except that the base layer 20 is replaced with the upper layer 40.

The thickness of the upper layer 40 is not limited, but is, for example, 10 nm or more and 1 μm or less.

In the method for manufacturing a semiconductor laminate 1 of the present embodiment, for example, after the p-type layer growth step S30, the upper layer growth step may be performed in the same manner as the base layer growth step S20.

(2) Effect of the Present Embodiment

In the present embodiment, by the Mg doping control described above, mixing of Mg into the upper layer 40 as a non-p-type layer, can be suppressed. Thereby, the D/E rate of the Mg concentration in the vicinity of the interface between the p-type layer 30 and the upper layer 40 is 100 or more, that is, the Mg concentration can be changed sharply. As a result, a gate region in the trench gate structure can be clearly defined, and a gate length can be equivalent to a thickness of the p-type layer 30.

Other Embodiment of the Present Invention

As described above, the embodiments of the present invention have been specifically described. However, the present invention is not limited to the above-described embodiments, and various modifications can be made without departing from the gist of the present invention.

In the above-described embodiment, the case where the substrate 10 is a GaN free-standing substrate has been described, but the substrate 10 may comprise other material. Specifically, the substrate 10 may comprise silicon carbide (SiC), Si, sapphire (Al$_2$O$_3$).

In the above-described embodiment, the case where each of the semiconductor layers of the base layer 20, the p-type layer 30, and the upper layer 40 comprises a GaN single crystal, has been described. However, the present invention is not limited to this case. Each semiconductor layer is not limited to single crystal GaN. Each semiconductor layer comprises a group III nitride crystal, for example, aluminum nitride (AlN), aluminum gallium nitride (AlGaN), indium nitride (InN), indium gallium nitride (InGaN), aluminum indium gallium nitride (AlInGaN), etc., that is, a single crystal represented by a composition formula of In$_x$Al$_y$Ga$_{1-x-y}$N (where 0≤x≤1, 0≤y≤1, 0≤x+y≤1).

In the above-described embodiment, the case where the semiconductor laminate 1 has the base layer 20, the p-type layer 30 and the upper layer 40 on the substrate 10 in this order, has been described. However, the present invention is not limited to this case. For example, the semiconductor laminate 1 may not have the base layer 20 and may have the p-type layer 30 and the upper layer 40 on the substrate 10 in this order.

In the above-described embodiment, the vertical pn junction diode or the vertical trench gate structure FET is described as a semiconductor device manufactured by the semiconductor laminate 1. However, the semiconductor laminate 1 may be used to manufacture other semiconductor device. For example, the semiconductor laminate 1 may be configured to produce lateral devices. For example, the semiconductor laminate 1 for manufacturing a lateral power device may be manufactured by ion-implanting the p-type layer 30 with an n-type impurity such as Si after growing the base layer 20 and the p-type layer 30.

Example

Experimental results that support the effect of the above-described embodiments will be described below.

(1) Semiconductor Laminate

Semiconductor laminates of Sample A and Samples B1 to B3 were produced in the following manner.

[Same Conditions]

The following conditions are the same for Sample A and Samples B1 to B3.

Substrate: GaN free-standing substrate
Plane orientation of the main surface of the substrate: +c plane
Substrate diameter: 2 inches (50.8 mm)
Substrate thickness: 500 μm

[Sample A: HVPE Method of the Present Disclosure]

In sample A, an apparatus with at least the surface of the member constituting a high temperature reaction zone comprising SiC, was used as the HVPE apparatus described above. After introducing the Ga source material and MgF$_2$, a high temperature bake step was performed before the crystal growth step was performed. At this time, the pressure condition was 1 atm and the temperature of the high temperature reaction zone was 1500° C. After the high temperature bake step, the substrate was placed inside the reaction vessel through the glove box.

Next, in the base layer growth step, a base layer comprising GaN was grown on the substrate. In this sample A, the base layer was non-doped. Further, the temperature of the downstream side zone heater and susceptor was 1050° C., and the thickness of the base layer was 5 μm.

After the base layer growth step, the p-type layer growth step was performed without exposing the reaction chamber to the atmosphere. The p-type layer comprising GaN was doped with Mg by transporting MgF$_2$ while etching it with HCl gas. At this time, the temperature of the downstream side zone heater and susceptor was kept equal to that of the base layer growth step, and the thickness of the p-type layer was 3 μm.

In sample A, a plurality of semiconductor laminates with different Mg concentrations were manufactured by changing the partial pressure of HCl gas supplied to the MgF$_2$ line.

[Sample B1: HVPE Method Using Mg$_3$N$_2$]

In sample B1, a semiconductor device was manufactured in the same manner as in sample A, except that Mg$_3$N$_2$ was used as the Mg dopant in the p-type layer growth step. H$_2$ gas was supplied as a carrier gas for Mg$_3$N$_2$.

[Sample B2: Conventional HVPE Method]

In sample B2, as a conventional HVPE method, a HVPE apparatus with the high temperature reaction zone comprising quartz was used, and no high temperature bake step was performed. Metal Mg was used as the Mg dopant in the p-type layer growth step. Other conditions in sample B2 were the same as those in sample B1.

[Sample B3: MOCVD Method]

In sample B3, the semiconductor laminate was manufactured by the MOCVD method. $Cp_2Mg$ gas was supplied as the Mg dopant gas in the p-type layer growth step. A layer structure of the semiconductor laminate in sample B3 was the same as that in sample B1. Other conditions for sample B3 were set to a standard condition of the conventional MOCVD method.

Also in Samples B1 to B3, a plurality of semiconductor laminates having different Mg concentrations were manufactured.

(2) Evaluation

The semiconductor laminates of Sample A and Samples B 1 to B3 were evaluated as follows.

[SIMS]

Each concentration of Mg, C, O, Si, B and Fe in the p-type layer of each of Sample A and Samples B1 to B3 was measured by SIMS depth profile analysis.

[Hole Concentration]

The hole concentration in the p-type layer of the semiconductor laminate was measured at a temperature of 23° C. by a hole effect measurement.

(3) Result

Evaluation results will be described with reference to Table 1 and FIGS. 5 to 7. Each impurity concentration in Table 1 indicates a concentration in the p-type layer. (Lower limit) in Table 1 indicates a lower limit of detection in each evaluation, and a result less than the lower limit of detection is indicated as "DL".

fore, in a low Mg concentration range, Mg activation rate was low. Further, in sample B3, due to no-content ofF, Mg activation rate tended to decrease slightly as the Mg concentration increased.

[Sample B2: Conventional HVPE Method]

As shown in Table 1, the concentrations of impurities other than Mg were high in sample B2. As illustrated in FIGS. 6 and 7, in sample B2, the hole concentration was low even at a high Mg concentration, and a sufficient Mg activation rate was not obtained.

In sample B2 of the conventional HVPE method, metal Mg as a dopant reacted with the quartz constituting the high temperature reaction zone, thereby making it difficult to transport the dopant. Further, a high concentration of Si or O as a compensating donor was mixed in the p-type layer from the quartz constituting the high temperature reaction zone. As a result, the hole concentration was low, and a sufficient Mg activation rate was not obtained.

[Sample B1: HVPE Method Using $Mg_3N_2$]

As shown in Table 1, in sample B1, the concentrations of impurities other than Mg in the p-type layer were low, and Mg concentration was obtained over a wide range. However, F concentration in the p-type layer was less than a lower limit of detection.

As illustrated in FIGS. 6 and 7, in sample B1, a higher Mg activation rate than sample B2 was obtained. However, in a range where Mg concentration was $2 \times 10^{18}$ $cm^{-3}$ or more, the hole concentration becomes low and Mg activation rate becomes low sharply.

Further, as illustrated in FIG. 5, in sample B1, Mg was detected even in the base layer. The Mg concentration changed gently between the base layer and the p-type layer.

TABLE 1

| | Sample A | Sample B1 HVPE method using $Mg_3N_2$ | Sample B2 Conventional HIVPE method | Sample B3 MOCVD method |
|---|---|---|---|---|
| Growth method | HVPE method | HVPE method | HVPE method | MOCVD method |
| Surface of high temperature reaction zone | SiC layer | SiC layer | No coat layer | — |
| Temperature of high temperature bake step | 1500° C. | 1500° C. | Not executed | — |
| Mg dopant | $MgF_2$ | $Mg_3N_2$ | Metal Mg | $Cp_2Mg$ gas |
| Mg concentration ($cm^{-3}$) (lower limit) $1 \times 10^{15}$ | $1 \times 10^{16} \sim 1 \times 10^{20}$ | $1 \times 10^{16} \sim 1 \times 10^{20}$ | $3 \times 10^{18} \sim 1 \times 10^{20}$ | $1 \times 10^{16} \sim 1 \times 10^{20}$ |
| C concentration ($cm^{-3}$) (lower limit) $5 \times 10^{15}$ | DL | DL | $5 \times 10^{15} \sim 5 \times 10^{16}$ | $5 \times 10^{15} \sim 5 \times 10^{17}$ |
| O concentration ($cm^{-3}$) (lower limit) $5 \times 10^{15}$ | DL | DL | $1 \times 10^{16} \sim 1 \times 10^{17}$ | DL |
| Si concentration ($cm^{-3}$) (lower limit) $1 \times 10^{15}$ | DL | DL | $1 \times 10^{17} \sim 3 \times 16^{18}$ | DI |
| B concentration ($cm^{-3}$) (lower limit) $1 \times 10^{15}$ | DL | DL | $1 \times 10^{15} \sim 1 \times 10^{17}$ | DL |
| Fe concentration ($cm^{-3}$) (lower limit) $1 \times 10^{15}$ | DL | DL | $1 \times 10^{15} \sim 1 \times 10^{18}$ | DL |
| F concentration ($cm^{-3}$) (lower limit) $1 \times 10^{14}$ | $1 \times 10^{14} \sim 1 \times 10^{15}$ | DL | $1 \times 10^{15} \sim 1 \times 10^{16}$ | DL |
| Hole concentration ($cm^{-3}$) | $1 \times 10^{15} \sim 1 \times 10^{19}$ | $1 \times 10^{13} \sim 1 \times 10^{17}$ | $5 \times 10^{15} \sim 2 \times 10^{16}$ | $1 \times 10^{15} \sim 1 \times 10^{18}$ |

[Sample B3: MOCVD Method]

As illustrated in Table 1, in sample B3, the concentrations of impurities other than Mg and C in the p-type layer were low, and Mg concentration was obtained over a wide range. F concentration in the p-type layer was less than the lower limit of detection.

As illustrated in FIGS. 6 and 7, in sample B3, Mg activation rate of 1% or more was obtained over a wide range of Mg concentration. However, Mg activation rate was low in a range where the Mg concentration was $2 \times 10^{17}$ $cm^{-3}$ or less and in a range where the Mg concentration was $2 \times 10^{18}$ $cm^{-3}$ or more.

In sample B3 by the MOCVD method, Mg concentration could be controlled relatively easily by using $Cp_2Mg$ gas as a dopant. However, in sample B3, since C was mixed in the p-type layer as an impurity, C compensated for Mg. There- In sample B1 of the HVPE method using $Mg_3N_2$, F was not incorporated into the p-type layer because the Mg dopant did not contain F. Therefore, a sufficient Mg activation rate was not obtained in a high Mg concentration range.

Further, in sample Bi, since the Mg-containing gas was constantly supplied from the $Mg_3N_2$ arranged in the reaction vessel, a certain amount of Mg was incorporated into the base layer.

[Sample A]

As shown in Table 1, in sample A, the concentration of impurities other than Mg and F in the p-type layer was low, and Mg concentration was obtained over a wide range. On the other hand, F concentration in the p-type layer was $1 \times 10^{14}$ $cm^{-3}$ or higher.

Further, as illustrated in FIG. 6 and FIG. 7, in sample A, higher hole concentration and higher Mg activation rate than those in sample B1 by the MOCVD method, were obtained over a wide range of the Mg concentration. That is, Mg activation rate in the p-type layer was 11% or more in a range where Mg concentration in the p-type layer of sample A was less than $1\times10^{18}$ cm$^{-3}$. Further, the p-type layer satisfied formula (1) (Y≥−5.5 log X+110) which is the formula for the activation rate described above, in a range where Mg concentration in the p-type layer of sample A is $1\times10^{18}$ cm$^{-3}$ or more.

Further, as illustrated in FIG. 5, in sample A, the Mg concentration changed sharply between the base layer and the p-type layer. Specifically, the B/A ratio of the Mg concentration comparing both sides in the vicinity of the interface between the base layer and the p-type layer, was 100 or more.

In sample A, a spike-shaped peak in which Si concentration is 10 times higher than Si concentration at a position 100 nm from the interface between the base layer and the p-type layer toward the base layer in a thickness direction, was not formed between the base layer and the p-type layer in the SIMS depth profile.

In sample A according to the present disclosure, by incorporating a predetermined amount of Mg and a small amount of F into the p-type layer while suppressing incorporation of the compensating impurities into the p-type layer, it was confirmed that the hole concentration could be obtained over a wide range in the p-type layer.

Further, in sample A, by controlling Mg doping by supplying the halogen-containing gas having an etching action to MgF$_2$, it was confirmed that the Mg concentration was changed sharply in the vicinity of the interface between the base layer and the p-type layer.

Preferable Aspects of the Present Invention

Preferable aspects of the present invention will be described hereafter.
(Supplementary Description 1)
There is provided a semiconductor laminate, including:
a substrate; and
a p-type layer provided above the substrate and comprising a group III nitride containing Mg, wherein
C concentration in the p-type layer is less than $5\times10^{15}$ cm$^{-3}$,
O concentration in the p-type layer is less than $5\times10^{15}$ cm$^{-3}$,
Si concentration in the p-type layer is less than $1\times10^{15}$ cm$^{-3}$, and
F concentration in the p-type layer is $1\times10^{14}$ cm$^{-3}$ or more.
(Supplementary Description 2)
There is provided the semiconductor laminate according to supplementary description 1, wherein F concentration in the p-type layer is $1\times10^{16}$ cm$^{-3}$ or less.
(Supplementary Description 3)
There is provided the semiconductor laminate according to supplementary description 1 or 2, including:
a base layer provided between the substrate and the p-type layer and comprising a group III nitride, wherein
C concentration in the base layer is less than $5\times10^{15}$ cm$^{-3}$,
O concentration in the base layer is less than $5\times10^{15}$ cm$^{-3}$, and
a B/A ratio of Mg concentration comparing both sides in the vicinity of an interface between the base layer and the p-type layer is 100 or more,
wherein the A is Mg concentration at a position 100 nm from the interface toward the base layer in a thickness direction, and
the B is Mg concentration at a position 100 nm from the interface toward the p-type layer in a thickness direction.
(Supplementary Description 4)
There is provided a semiconductor laminate, including:
a substrate;
a base layer provided on the substrate and comprising a group III nitride; and
a p-type layer provided on the base layer and comprising a group III nitride containing Mg, wherein
C concentration in each of the base layer and the p-type layer is less than $5\times10^{15}$ cm$^{-3}$
O concentration in each of the base layer and the p-type layer is less than $5\times10^{15}$ cm$^{-3}$,
Si concentration in the p-type layer is less than $1\times10^{15}$ cm$^{-3}$, and
a B/A ratio of Mg concentration comparing both sides in the vicinity of an interface between the base layer and the p-type layer is 100 or more,
wherein the A is Mg concentration at a position 100 nm from the interface toward the base layer in a thickness direction, and
The B is Mg concentration at a position 100 nm from the interface toward the p-type layer in a thickness direction.
(Supplementary Description 5)
There is provided the semiconductor laminate according to any one of supplementary descriptions 1 to 4, wherein the p-type layer has a thickness of 10 nm or more and 5 μm or less.
(Supplementary Description 6)
There is provided the semiconductor laminate according to any one of supplementary descriptions 1 to 5, wherein each of B concentration and Fe concentration in the p-type layer is less than $1\times10^{15}$ cm$^{-3}$.
(Supplementary Description 7)
There is provided the semiconductor laminate according to any one of supplementary descriptions 1 to 6, including:
an upper layer provided on the p-type layer and comprising a group III nitride, wherein
C concentration in the upper layer is less than $5\times10^{15}$ cm$^{-3}$,
O concentration in the upper layer is less than $5\times10^{15}$ cm$^{-3}$, and
a D/E ratio of Mg concentration comparing both sides in the vicinity of an interface between the upper layer and the p-type layer is 100 or more,
wherein the D is Mg concentration at a position 100 nm from the interface toward the p-type layer in a thickness direction, and
the E is Mg concentration at a position 100 nm from the interface toward the upper layer in a thickness direction.
(Supplementary Description 8)
There is provided the semiconductor laminate according to any one of supplementary descriptions 1 to 7, wherein
Mg concentration in the p-type layer is less than $1\times10^{18}$ cm$^{-3}$, and
Mg activation rate obtained by a hole concentration in the p-type layer at 23° C. with respect to the Mg concentration in the p-type layer is 11% or more.
(Supplementary Description 9)
There is provided the semiconductor laminate according to any one of supplementary descriptions 1 to 7, wherein Mg concentration in the p-type layer is $1\times10^{18}$ cm$^{-3}$ or more, and the p-type layer satisfies formula (1), $$Y \geq -5.5\log X + 110 \qquad (1)$$

wherein X is Mg concentration in the p-type layer expressed by cm$^{-3}$, and

Y is a ratio of a hole concentration in the p-type layer at 23° C. with respect to the Mg concentration in the p-type layer and is Mg activation rate expressed by %.

(Supplementary Description 10)

There is provided the semiconductor laminate according to any one of supplementary descriptions 1 to 9, wherein the hole concentration in the p-type layer at 23° C. is $1\times10^{15}$ cm$^{-3}$ or more and $5\times10^{18}$ cm$^{-3}$ or less.

(Supplementary Description 11)

There is provided a method for manufacturing a semiconductor laminate, including:

preparing a substrate and preparing a hydride vapor phase epitaxy apparatus in which the substrate is housed; and growing a p-type layer comprising a group III nitride containing Mg above the substrate by the hydride vapor phase epitaxy apparatus, wherein in the growing the p-type layer, the p-type layer is doped with Mg by transporting MgF$_2$ while etching it with a halogen-containing gas.

(Supplementary Description 12)

There is provided the method for manufacturing a semiconductor laminate according to supplementary description 11, wherein the preparing the substrate includes:

preparing a vessel which has a high temperature reaction zone heated to a group III nitride crystal growth temperature and is in contact with a gas supplied to the substrate, and in which at least a surface of a member constituting the high temperature reaction zone comprises a quartz-free and boron-free material, as a reaction vessel in the hydride vapor phase epitaxy apparatus; and cleaning and modifying the surface of the member constituting the high temperature reaction zone by not executing supply of the nitrogen source gas into the reaction vessel and executing supply of a hydrogen gas and a halogen-containing gas into the reaction vessel, while heating the temperature of the high temperature reaction zone to a temperature of 1500° C. or higher, as a high temperature bake step; and housing the substrate in the reaction vessel.

(Supplementary Description 13)

There is provided the semiconductor laminate according to supplementary description 11 or 12, wherein in the growing the p-type layer, C concentration in the p-type layer is less than $5\times10^{15}$ cm$^{-3}$, O concentration in the p-type layer is less than $5\times10^{15}$ cm$^{-3}$, Si concentration in the p-type layer is less than $1\times10^{15}$ cm$^{-3}$, and F concentration in the p-type layer is $1\times10^{14}$ cm$^{-3}$ or more.

(Supplementary Description 14)

There is provided a method for manufacturing a semiconductor laminate according to any one of supplementary descriptions 1 to 13, including:

growing a base layer comprising a group III nitride on the substrate after preparing the substrate and before growing the p-type layer, and in the growing the base layer, C concentration in the base layer is less than $5\times10^{15}$ cm$^{-3}$, O concentration in the base layer is less than $5\times10^{15}$ cm$^{-3}$, and a B/A ratio of Mg concentration comparing both sides in the vicinity of an interface between the base layer and the p-type layer is 100 or more, wherein the A is Mg concentration at a position 100 nm from the interface toward the base layer in a thickness direction, and the B is Mg concentration at a position 100 nm from the interface toward the p-type layer in a thickness direction.

LIST OF REFERENCE NUMERALS

10 substrate
20 base layer
30 p-type layer
40 upper layer

What is claimed is:

1. A semiconductor laminate, comprising:

a substrate; and a p-type layer provided above the substrate and comprising a group III nitride containing Mg, wherein C concentration in the p-type layer is less than $5\times10^{15}$ cm$^{-3}$, O concentration in the p-type layer is less than $5\times10^{15}$ cm$^{-3}$, Si concentration in the p-type layer is less than $1\times10^{15}$ cm$^{-3}$, and F concentration in the p-type layer is $1\times10^{14}$ cm$^{-3}$ or more.

2. The semiconductor laminate according to claim 1, comprising:

a base layer provided between the substrate and the p-type layer and comprising a group III nitride, wherein C concentration in the base layer is less than $5\times10^{15}$ cm$^{-3}$, O concentration in the base layer is less than $5\times10^{15}$ cm$^{-3}$, and a B/A ratio of Mg concentration comparing both sides in the vicinity of an interface between the base layer and the p-type layer is 100 or more, wherein the A is Mg concentration at a position 100 nm from the interface toward the base layer in a thickness direction, and the B is Mg concentration at a position 100 nm from the interface toward the p-type layer in a thickness direction.

3. A semiconductor laminate, comprising:

a substrate;

a base layer provided on the substrate and comprising a group III nitride; and a p-type layer provided on the base layer and comprising a group III nitride containing Mg, wherein C concentration in each of the base layer and the p-type layer is less than $5\times10^{15}$ cm$^{-3}$, O concentration in each of the base layer and the p-type layer is less than $5\times10^{15}$ cm$^{-3}$, Si concentration in the p-type layer is less than $1\times10^{15}$ cm$^{-3}$, and a B/A ratio of Mg concentration comparing both sides in the vicinity of an interface between the base layer and the p-type layer is 100 or more, wherein the A is Mg concentration at a position 100 nm from the interface toward the base layer in a thickness direction, and the B is Mg concentration at a position 100 nm from the interface toward the p-type layer in a thickness direction.

4. The semiconductor laminate according to claim 1, wherein the p-type layer has a thickness of 10 nm or more and 5 µm or less.

5. The semiconductor laminate according to claim 1, wherein each of B concentration and Fe concentration in the p-type layer is less than $1\times10^{15}$ cm$^{-3}$.

6. The semiconductor laminate according to claim 1, comprising:

an upper layer provided on the p-type layer and comprising a group III nitride, wherein C concentration in the upper layer is less than $5\times10^{15}$ cm$^{-3}$, O concentration in the upper layer is less than $5\times10^{15}$ cm$^{-3}$, and a D/E ratio of Mg concentration comparing both sides in the vicinity of an interface between the upper layer and the p-type layer is 100 or more, wherein the D is Mg concentration at a position 100 nm from the interface toward the p-type layer in a thickness direction, and the E is Mg concentration at a position 100 nm from the interface toward the upper layer in a thickness direction.

7. The semiconductor laminate according to claim 1, wherein Mg concentration in the p-type layer is less than $1\times10^{18}$ cm$^{-3}$, and Mg activation rate obtained by a hole concentration in the p-type layer at 23° C. with respect to the Mg concentration in the p-type layer is 11% or more.

8. The semiconductor laminate according to claim 1, wherein

Mg concentration in the p-type layer is $1\times10^{18}$ cm$^{-3}$ or more, and the p-type layer satisfies formula (1)

$$Y \geq -5.5 \times \log X + 110 \qquad (1)$$

wherein X is Mg concentration in the p-type layer expressed by cm$^{-3}$, and

Y is a ratio of a hole concentration in the p-type layer at 23° C. with respect to the Mg concentration in the p-type layer and is Mg activation rate expressed by %.

9. The semiconductor laminate according to claim 3, wherein the p-type layer has a thickness of 10 nm or more and 5 µm or less.

10. The semiconductor laminate according to claim 3, wherein each of B concentration and Fe concentration in the p-type layer is less than $1\times10^{15}$ cm$^{-3}$.

11. The semiconductor laminate according to claim 3, comprising:

an upper layer provided on the p-type layer and comprising a group III nitride, wherein C concentration in the upper layer is less than $5\times10^{15}$ cm$^{-3}$, O concentration in the upper layer is less than $5\times10^{15}$ cm$^{-3}$, and a D/E ratio of Mg concentration comparing both sides in the vicinity of an interface between the upper layer and the p-type layer is 100 or more, wherein the D is Mg concentration at a position 100 nm from the interface toward the p-type layer in a thickness direction, and the E is Mg concentration at a position 100 nm from the interface toward the upper layer in a thickness direction.

12. The semiconductor laminate according to claim 3, wherein Mg concentration in the p-type layer is less than $1\times10^{18}$ cm$^{-3}$, and Mg activation rate obtained by a hole concentration in the p-type layer at 23° C. with respect to the Mg concentration in the p-type layer is 11% or more.

13. The semiconductor laminate according to claim 3, wherein

Mg concentration in the p-type layer is 1×1018 cm$^{-3}$ or more, and the p-type layer satisfies formula (1)

$$Y \geq -5.5 \times \log X + 110 \qquad (1)$$

wherein X is Mg concentration in the p-type layer expressed by cm$^{-3}$, and Y is a ratio of a hole concentration in the p-type layer at 23° C. with respect to the Mg concentration in the p-type layer and is Mg activation rate expressed by %.

14. A method for manufacturing the semiconductor laminate of claim 1, comprising:

preparing the substrate and preparing a hydride vapor phase epitaxy apparatus in which the substrate is housed; and growing the p-type layer comprising a group III nitride containing Mg above the substrate by the hydride vapor phase epitaxy apparatus, wherein in the growing the p-type layer, the p-type layer is doped with Mg by transporting MgF$_2$ while etching it with a halogen-containing gas.

* * * * *